United States Patent
Wang

(10) Patent No.: US 10,165,638 B1
(45) Date of Patent: Dec. 25, 2018

(54) CONTROLLER STRUCTURE FOR LED LIGHT STRINGS

(71) Applicant: Guang Zhou Ting Shen Electric Co., Ltd., Guang zhou, Guangdon Province (CN)

(72) Inventor: Chia-Chun Wang, Hsinchu County (TW)

(73) Assignee: GUANG ZHOU TING SHEN ELECTRIC CO., LTD., Guang Zhou, Guangdong (CN)

( * ) Notice: Subject to any disclaimer, the term of this patent is extended or adjusted under 35 U.S.C. 154(b) by 24 days.

(21) Appl. No.: 15/619,434

(22) Filed: Jun. 9, 2017

(51) Int. Cl.
| | |
|---|---|
| H05B 37/02 | (2006.01) |
| H01R 33/955 | (2006.01) |
| F21S 8/00 | (2006.01) |
| H01H 13/06 | (2006.01) |
| H05B 33/08 | (2006.01) |
| H05K 5/00 | (2006.01) |
| H05K 5/02 | (2006.01) |
| H05K 5/03 | (2006.01) |

(52) U.S. Cl.
CPC ....... *H05B 33/0842* (2013.01); *H05K 5/0017* (2013.01); *H05K 5/0026* (2013.01); *H05K 5/0247* (2013.01); *H05K 5/03* (2013.01)

(58) Field of Classification Search
CPC .... F21V 23/045; F21V 23/06; F21V 33/0028; F21V 23/001; F21V 23/003; F21V 23/008; F21W 2121/04; F21Y 2101/00; F21Y 2115/10; H05B 37/0218

USPC ......... 250/214 AL; 361/688, 689, 690, 694, 361/695, 697, 704, 707, 719
See application file for complete search history.

(56) References Cited

U.S. PATENT DOCUMENTS

| | | | | |
|---|---|---|---|---|
| 6,411,514 | B1* | 6/2002 | Hussaini | H05K 7/209 165/104.33 |
| 7,609,006 | B2* | 10/2009 | Gibboney | H05B 33/0803 315/185 S |
| 9,291,318 | B1* | 3/2016 | Benson | H05B 33/0857 |
| 9,781,781 | B2* | 10/2017 | Huang | H05B 33/0809 |
| 2007/0091575 | A1* | 4/2007 | Hussaini | H02J 7/0042 361/715 |
| 2010/0108863 | A1* | 5/2010 | Yang | H05B 37/0218 250/214 AL |
| 2016/0178172 | A1* | 6/2016 | Boyink | F21V 23/003 362/123 |
| 2017/0135166 | A1* | 5/2017 | Huang | H05B 33/0809 |

\* cited by examiner

*Primary Examiner* — Wei Chan

(57) ABSTRACT

A controller structure is applied to electrically conduct at least one LED light string and contains: a control box, a high voltage circuit unit, and a lid. The control box includes an opening, a hollow accommodation portion, two pins, and a first fitting portion. The high voltage circuit unit is accommodated in the hollow accommodated portion and includes an input segment and an output segment, a positive-electrode contact and a negative-electrode contact of the input segment are electrically connected with the two pins, a positive-electrode contact and a negative-electrode contact of the output segment are electrically connected with at least two power wires, and the high voltage circuit unit further includes a control unit. The lid covers the opening and includes a socket and a connection portion which is electrically connected with the output segment of the high voltage circuit unit via the at least two power wires.

4 Claims, 6 Drawing Sheets

CONTROLLER STRUCTURE FOR LED LIGHT STRINGS

FIELD OF THE INVENTION

The present invention relates to a controller structure which is applied to electrically conduct at least one LED light string and avoids water flowing into a control box.

BACKGROUND OF THE INVENTION

As shown in FIGS. 1-2, a conventional controller 1A for at least one LED light string contains: a body 10A, a hollow accommodation portion 11A defined in the body 10A, multiple locking portions 15A arranged in the hollow accommodation portion 11A, a first fitting segment 14A surrounding a peripheral side of the hollow accommodation portion 11A of the body 10A, a first input protrusion 13A formed on a first end of the body 10A, and a first output protrusion 12A arranged on a second end of the body 10A.

A circuit board 20A is housed in the hollow accommodation portion 11A of the body 10A, and the circuit board 20A includes electronic elements 21A, a power input wire 23A connected on a first end of the circuit board 20A and accommodated in the first input protrusion 13A of the body 10A, and a power output wire 22A coupled on a second end of the circuit board 20A and housed in the first output protrusion 12A of the body 10A.

A lid 30A includes a connection portion 31A formed on a bottom thereof and connecting with the first fitting segment 14A of the body 10A, a second input protrusion 33A connecting with the first input protrusion 13A of the body 10A, and a second output protrusion 32A coupling with the first output protrusion 12A of the body 10A, such that the power input wire 23A and the power output wire 22A are limited. The lid 30A further includes multiple threaded orifices 34A screwing with the multiple locking portions 15A of the body 10A by way of plural screws 35A respectively, and the first fitting segment 14A of the body 10A, the connection portion 31A of the lid 30A, the power input wire 23A, and the power output wire 22A are applied silicone so as to obtain waterproof feature. However, the conventional controller 1A is manufactured troublesomely and the silicone drops easily, after a period of using time.

The present invention has arisen to mitigate and/or obviate the afore-described disadvantages.

SUMMARY OF THE INVENTION

The primary objective of the present invention is to provide a controller structure which is applied to electrically conduct at least one LED light string and avoids water flowing into a control box.

To obtain the above mentioned objective, a controller structure provided by the present invention contains: a control box, a high voltage circuit unit, and a lid.

The control box includes an opening defined in a first end of the control box, a hollow accommodation portion formed in the control box, two pins disposed on a second end of the control box, and a first fitting portion arranged on an outer wall of the control box adjacent to the opening.

The high voltage circuit unit is accommodated in the hollow accommodated portion of the control box, and the high voltage circuit unit includes an input segment and an output segment, a positive-electrode contact and a negative-electrode contact of the input segment being electrically connected with the two pins, a positive-electrode contact and a negative-electrode contact of the output segment being electrically connected with at least two power wires, and the high voltage circuit unit further including a control unit.

The lid is configured to cover the opening of the control box, wherein the lid includes a socket mounted on an outer wall thereof, a connection portion of an inner wall of the lid opposite to the socket is electrically connected with the output segment of the high voltage circuit unit via the at least two power wires.

The lid also includes a second fitting portion for fitting with the first fitting portion of the control box, wherein after the second fitting portion of the lid is fitted with the first fitting portion of the control box, the second fitting portion and the first fitting portion are ultrasonically welded together.

DETAILED DESCRIPTION OF THE PREFERRED EMBODIMENTS

Figure 1:
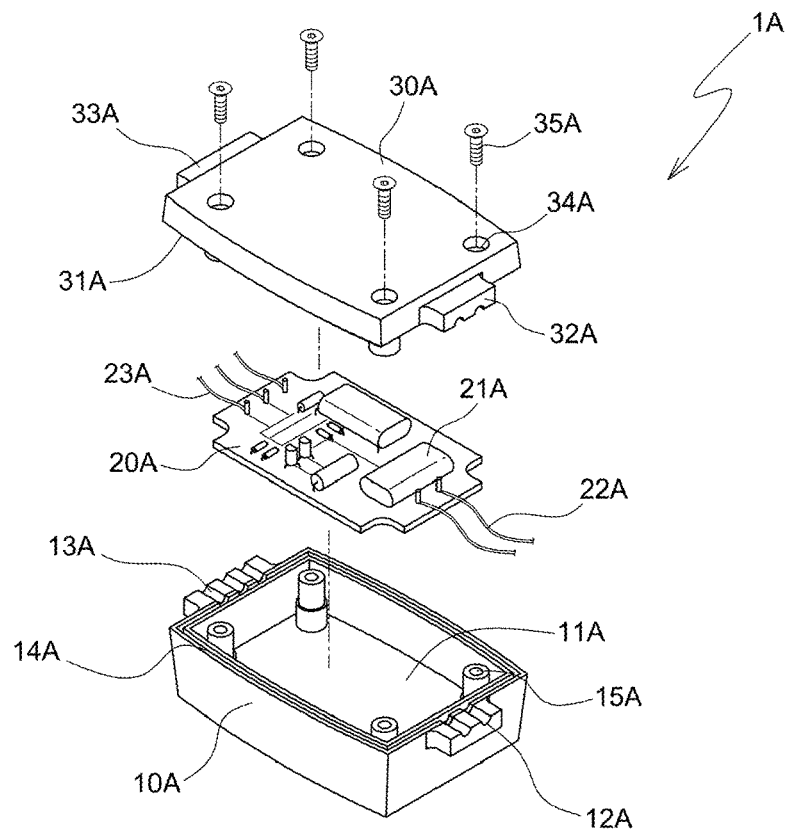
FIG. 1 is a perspective view showing the exploded components of a conventional controller structure for at least one LED light string.
Figure 2:
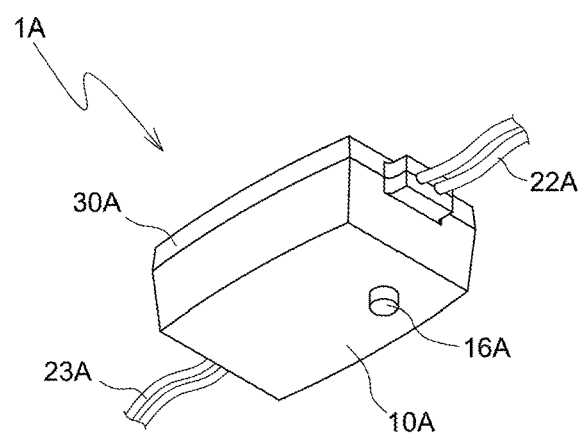
FIG. 2 is a perspective view showing the assembly of the conventional controller structure for the at least one LED light string.
Figure 3:
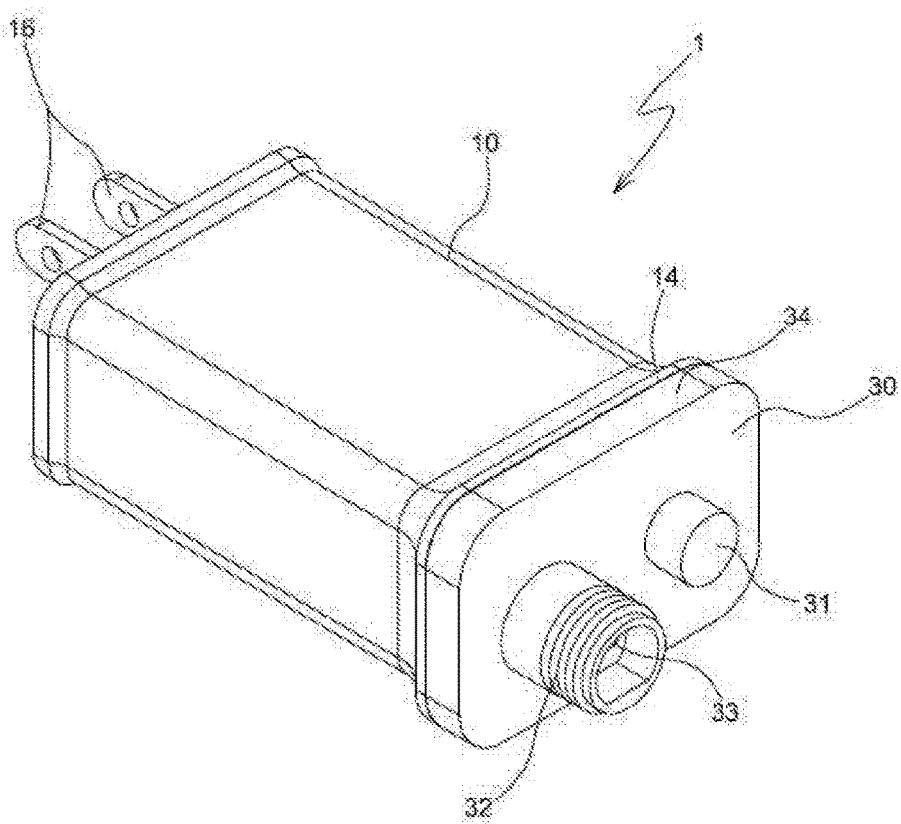
FIG. 3 is a perspective view showing the assembly of a controller structure for at least one LED light string according to a preferred embodiment of the present invention.
Figure 4:
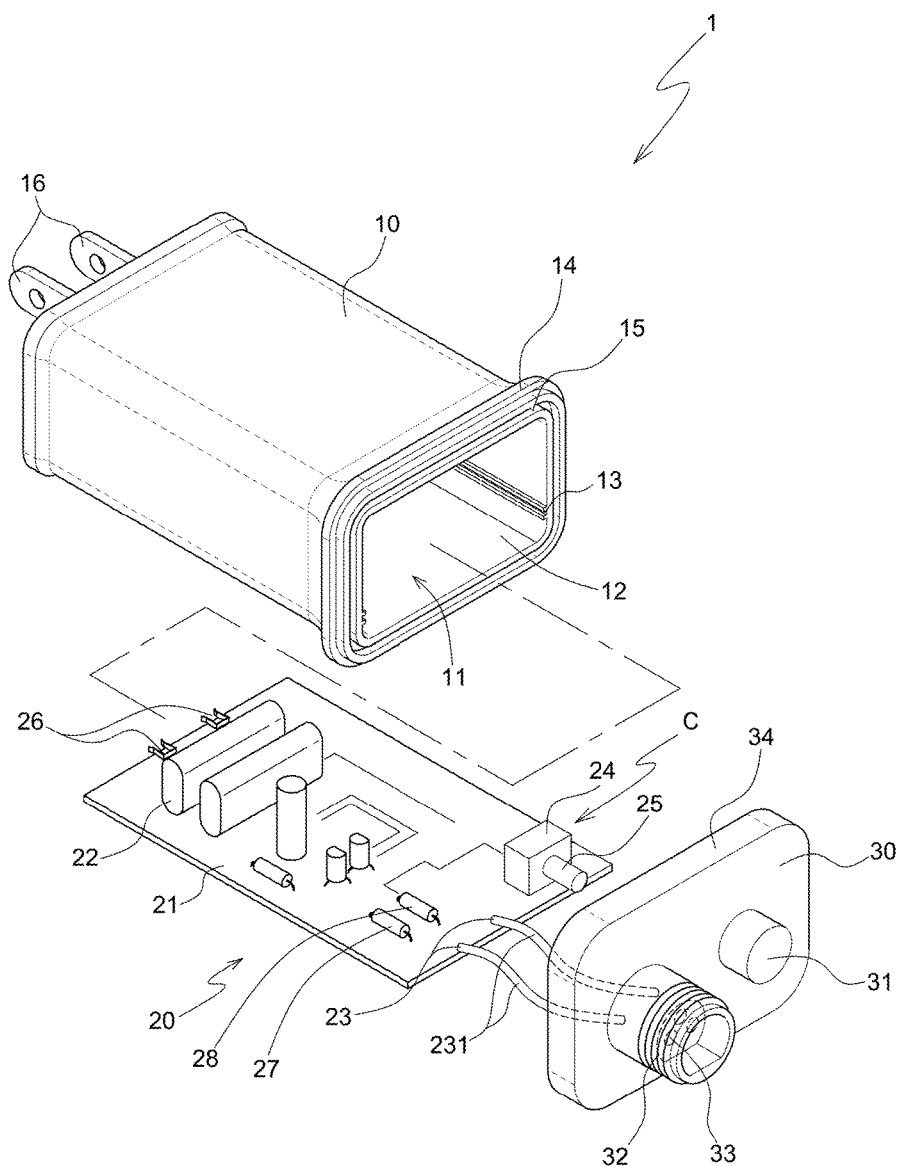
FIG. 4 is a perspective view showing the exploded components of the controller structure for the at least one LED light string according to the preferred embodiment of the present invention.
Figure 5:
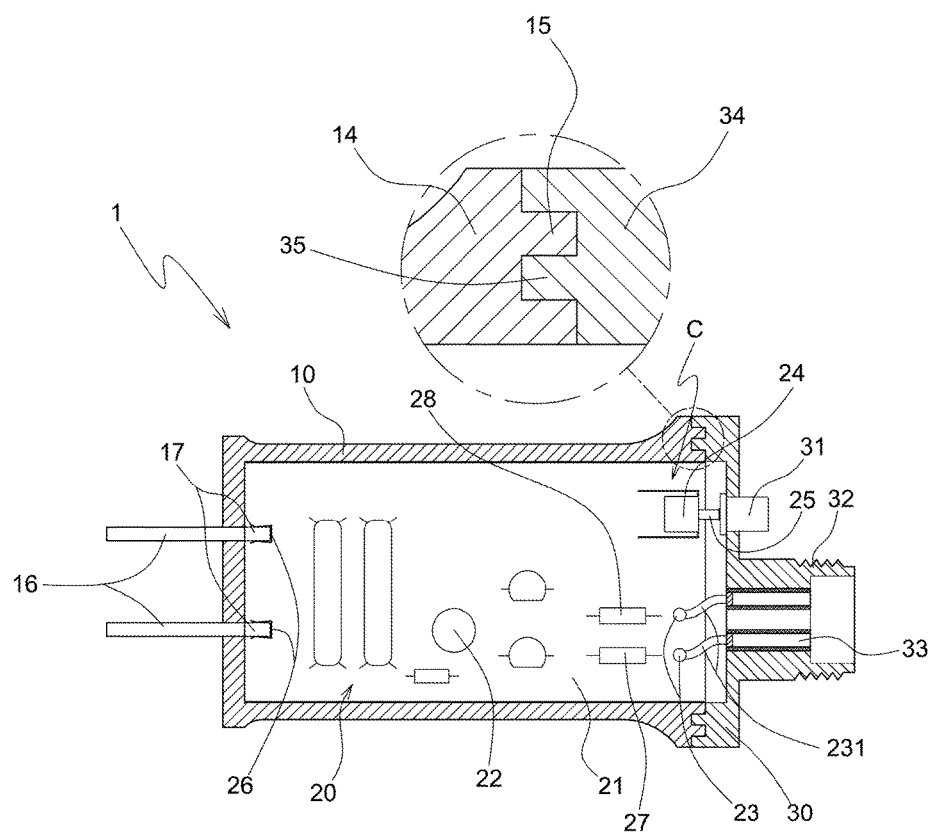
FIG. 5 is a cross sectional view showing the assembly of the controller structure for the at least one LED light string according to the preferred embodiment of the present invention.

With reference to FIGS. 3-7, a controller structure 1 according to a preferred embodiment of the present invention is applied to electrically conduct at least one LED light string and comprises: a control box 10, a high voltage circuit unit 20, and a lid 30.

The control box 10 includes an opening 12 defined in a first end thereof, a hollow accommodation portion 12 formed therein, two pins 16 disposed on a second end of the control box 10, a first fitting portion 14 arranged on an outer wall of the control box 10 adjacent to the opening 12.

A high voltage circuit unit 20 is accommodated in the hollow accommodated portion 11 of the control box 10, and the high voltage circuit unit 20 includes an input segment 26 and an output segment 23, wherein a positive-electrode contact and a negative-electrode contact of the input segment 26 are electrically connected with the two pins 16, a positive-electrode contact and a negative-electrode contact of the output segment 23 are electrically connected with at least two power wires 231, and the high voltage circuit unit 20 further includes a control unit C.

The lid 30 is configured to cover the opening 12 of the control box 10, and the lid 30 includes a socket 33 mounted on an outer wall thereof, a connection portion of an inner wall of the lid 30 opposite to the socket 33 is electrically connected with the output segment 23 of the high voltage circuit unit 20 via the at least two power wires 231. The lid 30 also includes a second fitting portion 34 for fitting with the first fitting portion 14 of the control box 10, wherein after the second fitting portion 34 of the lid 30 is fitted with the first fitting portion 14 of the control box 10, the second fitting portion 34 and the first fitting portion 14 are ultrasonically welded together so as to avoid water flowing into the control box 10.

The control unit C of the high voltage circuit unit 20 has a controlling seat 24 and a driven stem 25 fixed on the controlling seat 24, and the lid 30 further includes a button 31 arranged on the outer wall thereof adjacent to the socket 33 and corresponding to the driven stem 25.

Preferably, the high voltage circuit unit 20 further includes a circuit board 21 and multiple electronic elements 22 arranged on the circuit board 21 so as to execute input, output, rectification of high voltage power and to control circuit of the at least one LED light string. An SCR (silicon-controlled rectifier) 27 and a TRIAC (triode for alternating current) 28 are provided on the high voltage circuit unit 20. The SCR 27 is electrically connected to the TRIAC 28, which is in turn electrically connected to the controlling seat 24.

Preferably, the first fitting portion 14 of the control box 10 is multiple peripheral grooves 15, and the second fitting portion 34 of the lid 30 is multiple peripheral ribs 35.

Preferably, the hollow accommodation portion 11 of the control box 10 has two guiding rails 13 secured therein so as to slide and limit two peripheral sides of the high voltage circuit unit 20.

Preferably, the input segment 26 of the high voltage circuit unit 20 is two flexible C-shaped retainers, and the two pins 16 have two holders 17 respectively extending toward the hollow accommodation portion 11 of the control box 10 so that the input segment 26 of the high voltage circuit unit 20 movably connects with the two holders 17, and the two pins 16 electrically conduct with the input segment 26 of the high voltage circuit unit 20.

Preferably, a voltage of each of the input segment 26 and the output segment 23 is within 110V to 220V.

Figure 6:
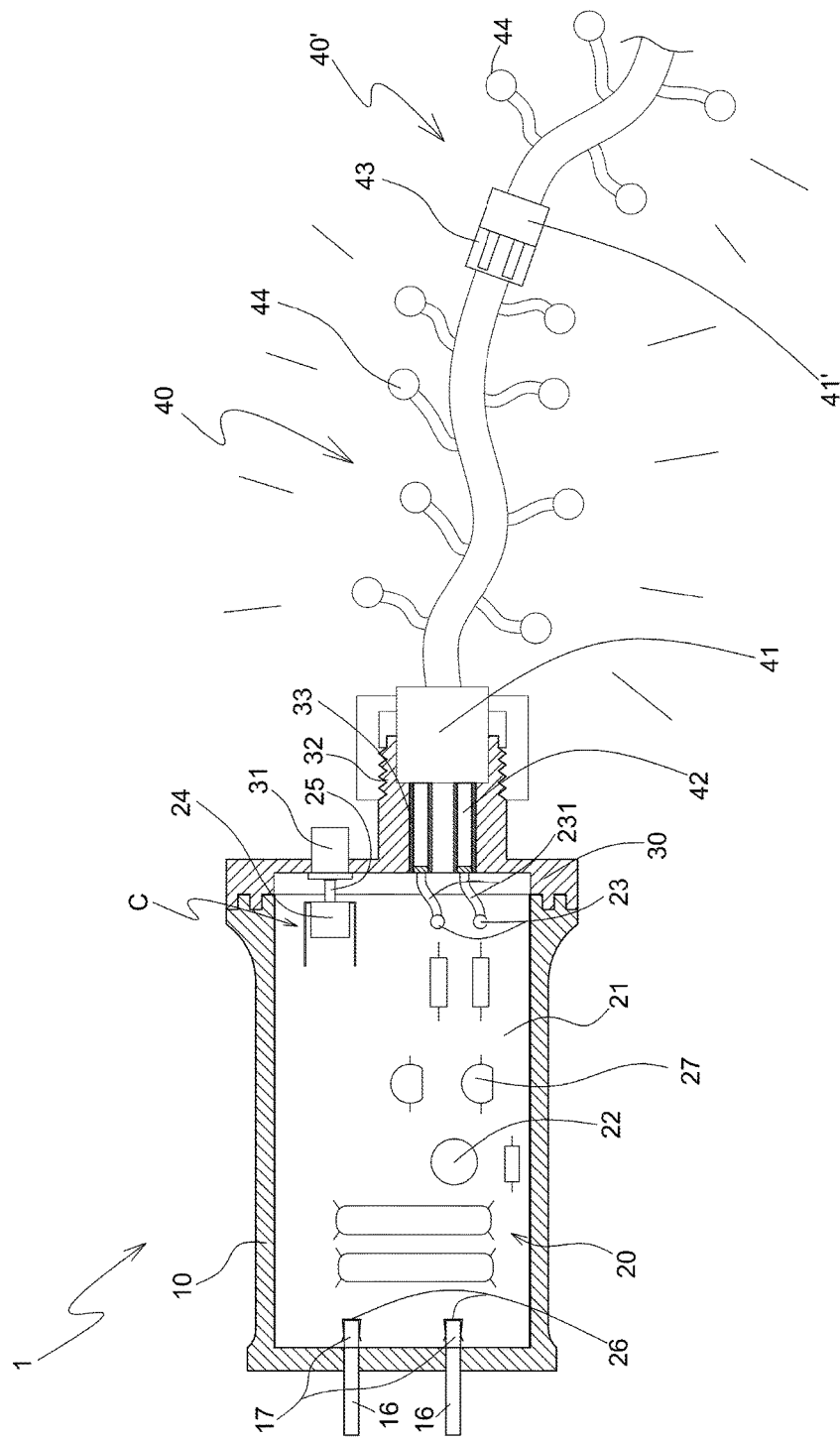
FIG. 6 is a cross sectional view showing the application of the controller structure for the at least one LED light string according to the preferred embodiment of the present invention.

Referring to FIG. 6, the socket 33 of the lid 30 is electrically connected with a connection segment 42 of a first electrical connector 41 of a first LED light string 40, the first LED light string 40 is electrically connected with LED bulbs 44, and the first LED light string 40 has a second electrical connector 43 disposed on a distal end thereof so as to electrically connect with a third electrical connector 41' of multiple second light strings 40'. The socket 33 of the lid 30 has a threaded section 32 defined around an outer wall thereof and screwed with the first electrical connector 41.

Figure 7:
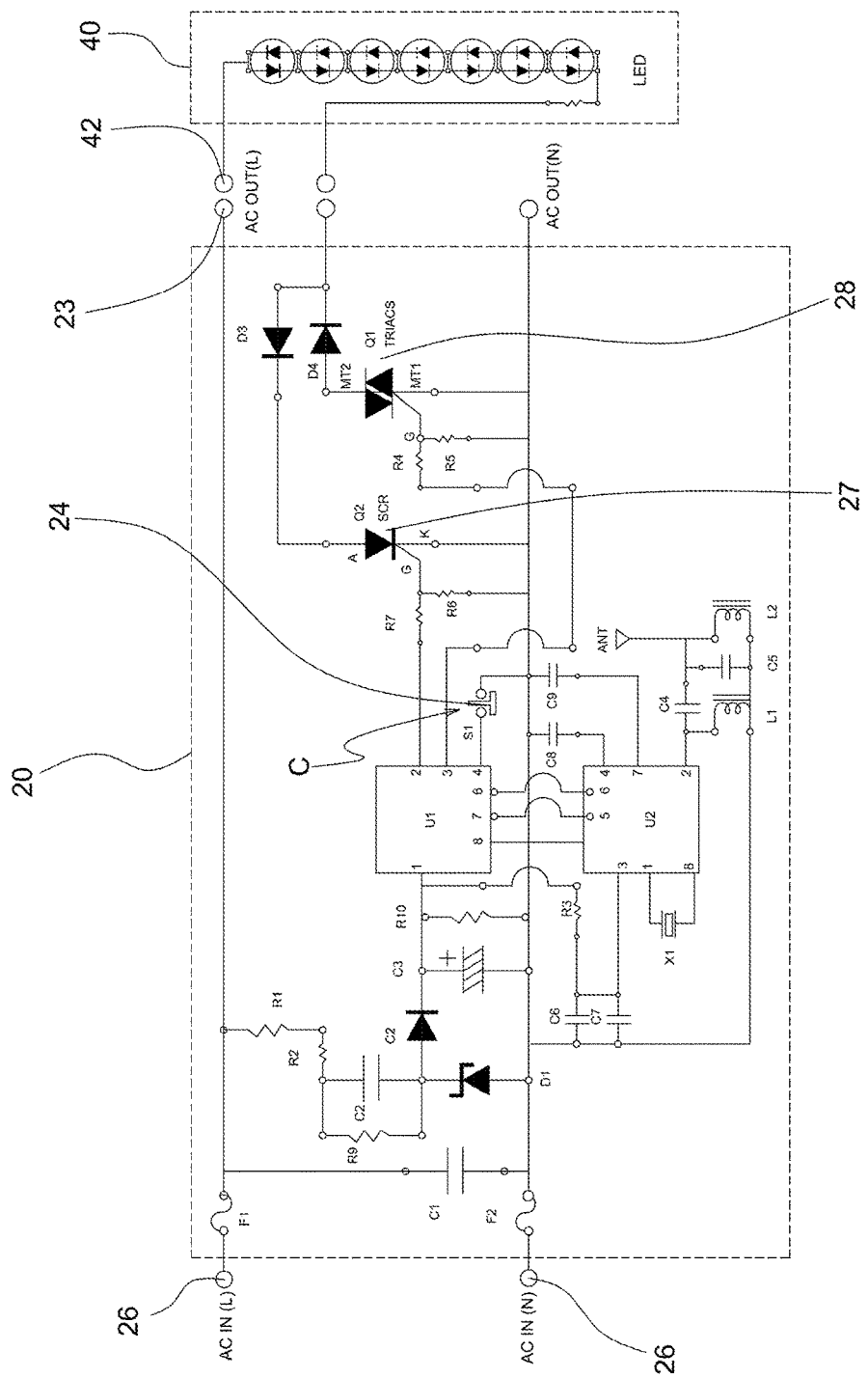
FIG. 7 is a circuit diagram showing the assembly of the controller structure and the at least one LED light string according to the first embodiment of the present invention.

As shown in FIG. 7, the high voltage circuit unit 20 includes the input segment 26, the output segment 23, and the controlling seat 24, wherein the output segment 23 is electrically connected with the connection segment 42 of the first LED light string 40.

Thereby, after the output segment 23 of the high voltage circuit unit 20 and the socket 33 of the lid 30 are connected with the at least two power wires 231, the high voltage circuit unit 20 is accommodated in the hollow accommodation portion 11 of the control box 10, and the first fitting portion 14 of the control box 10 is ultrasonically welded with the second fitting portion 34 of the lid 30 so as to avoid the water flowing into the control box 10 and to decrease manufacture time.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. A controller structure being applied to electrically conduct at least one LED light string and comprising:
   a control box including an opening defined in a first end of the control box, a hollow accommodation portion formed in the control box, two pins disposed on a second end of the control box, and a first fitting portion arranged on an outer wall of the control box adjacent to the opening;
   a high voltage circuit unit accommodated in the hollow accommodated portion of the control box, and the high voltage circuit unit including an input segment and an output segment, a positive-electrode contact and a negative-electrode contact of the input segment being electrically connected with the two pins, a positive-electrode contact and a negative-electrode contact of the output segment being electrically connected with at least two power wires, and the high voltage circuit unit further including a control unit; and
   a lid configured to cover the opening of the control box, wherein the lid includes a socket mounted on an outer wall thereof, a connection portion of an inner wall of the lid opposite to the socket is electrically connected with the output segment of the high voltage circuit unit via the at least two power wires; and
   wherein the lid also includes a second fitting portion for fitting with the first fitting portion of the control box, wherein after the second fitting portion of the lid is fitted with the first fitting portion of the control box, the second fitting portion and the first fitting portion are ultrasonically welded together;
   wherein after the output segment of the high voltage circuit unit and the socket of the lid are connected with the at least two power wires, the high voltage circuit unit is accommodated in the hollow accommodation portion of the control box, and the first fitting portion of the control box is ultrasonically welded with the second fitting portion of the lid;
   wherein the high voltage circuit unit further includes a circuit board, multiple electronic elements disposed on the circuit board, an SCR disposed on the circuit board, and a TRIAC disposed on the circuit board, the SCR is electrically connected to the TRIAC, and the TRIAC is electrically connected to the control unit to execute input, output, and rectification;
   the hollow accommodation portion of the control box has two guiding rails secured therein so as to slide and limit two peripheral sides of the high voltage circuit unit;
   the input segment of the high voltage circuit unit is two flexible C-shaped retainers, and the two pins have two holders respectively extending toward the hollow accommodation portion of the control box so that the input segment of the high voltage circuit unit movably connects with the two holders, and the two pins electrically conduct with the input segment of the high voltage circuit unit; and the control unit of the high voltage circuit unit has a controlling seat and a driven stem fixed on the controlling seat, and the lid further includes a button arranged on the outer wall thereof adjacent to the socket and corresponding to the driven stem.

2. The controller structure as claimed in claim 1, wherein the first fitting portion of the control box is multiple peripheral grooves, and the second fitting portion of the lid is multiple peripheral ribs.

3. The controller structure as claimed in claim 1, wherein the socket of the lid is electrically connected with a connection segment of a first electrical connector of a first LED light string, the first LED light string is electrically connected with LED bulbs, and the first LED light string has a second electrical connector disposed on a distal end thereof so as to electrically connect with a third electrical connector of multiple second light strings.

4. The controller structure as claimed in claim 3, wherein the socket of the lid has a threaded section defined around an outer wall thereof and screwed with the first electrical connector.

\* \* \* \* \*